July 2, 1963

H. NELSON 3,096,219

SEMICONDUCTOR DEVICES

Filed May 2, 1960

INVENTOR.
Herbert Nelson
BY
W.S. Hill
Agent

United States Patent Office 3,096,219
Patented July 2, 1963

3,096,219

SEMICONDUCTOR DEVICES

Herbert Nelson, Princeton, N.J., assignor to Radio Corporation of America, a corporation of Delaware Filed May 2, 1960, Ser. No. 26,176
12 Claims. (Cl. 148—1.5)

Figure 1:
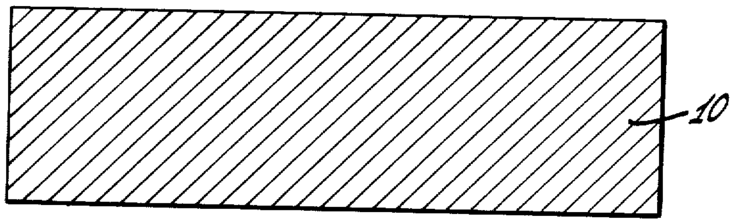

This invention relates to improved semiconductor devices utilizing compound semiconductive materials, and improved methods for making said devices.

Binary semiconductive compounds which can be obtained as pure single crystals are useful for the fabrication of electrical devices such as transistors, diodes, and solar batteries. Examples of such semiconductive compounds are the phosphides, arsenides, and antimonides of aluminum, gallium, and indium. This group of binary compounds is known as the III—V compounds, because the constituents of each compound are an element from column three and an element from column five of the periodic table. Another group of useful binary compounds consists of the sulfides, selenides, and tellurides of zinc, cadmium, and mercury. The latter group is known as the II—VI compounds, because the constituents of each compound are an element from column two and an element from column six of the periodic table. One of the two elements which forms a binary semiconductive compound is more volatile than the other element. The relatively volatile elements include phosphorus, arsenic, sulfur, selenium, and mercury, while the relatively nonvolatile elements include aluminum, gallium, zinc, cadmium, and tellurium. When utilized in semiconductor devices, the binary semiconductive compounds have been found to exhibit certain advantages over elemental semiconductors such as germanium and silicon. In particular, they exhibit increased electron mobility and improved ability to operate at high temperatures.

The semiconductive binary compounds also have certain disadvantages in device fabrication. It has been found more difficult to form a given conductivity region in a binary compound semiconductive wafer than in an elemental semiconductor wafer. Since the formation of given conductivity type regions within a semiconductor wafer is required for the fabrication of rectifying barriers, attempts have been made to utilize for this purpose those techniques, such as surface alloying, diffusion of an active impurity, and the like, which have been successful with the elemental semiconductors silicon and germanium. However, it has been found difficult to control the introduction of acceptors and donors into semiconductive compound wafers. Furthermore, for some purposes it is desirable to introduce relative larger amounts of the active impurity into the wafer, so as to form heavily doped regions within the wafer. For example, in the fabrication of tunnel diodes it is desirable that at least one region of the semiconductor wafer be heavily doped to the point where the semiconductor is said to be degenerate. For details as to the utilization of heavily doped regions in the fabrication of tunnel diodes, see H. S. Sommers, Jr., "Tunnel Diodes As High Frequency Devices," Proc. IRE, vol. 47, pp. 1201–1206, July 1959. It has been very difficult to achieve such heavily doped regions in binary compound wafers. For example, sulfur is a donor in III—V compounds, but sulfur is not suitable as an electrode pellet material for surface alloying. When attempts are made to diffuse sulfur into a wafer of a III—V compound such as gallium arsenide considerable erosion of the wafer takes place. It has been suggested that a doping agent such as selenium may be diffused into a wafer of a binary compound such as gallium arsenide by heating the wafer in an atmosphere of arsenic and the doping agent. The arsenic atmosphere prevents the erosion of the gallium arsenide wafer caused by evaporation of the volatile arsenic from the wafer surface. However, this method requires relatively high temperatures, close to the melting point of the semiconductive compound, at least 1000° C. being required for gallium arsenide. Heating time must be carefully limited in this method to avoid establishment of an equilibrium of a gallium arsenide body and the vapor phase. Furthermore, since this method depends on diffusion of the impurity from the vapor phase into the solid wafer, both the amount of the doping agent which is introduced into the wafer and the decrease in concentration of the doping agent with increasing depth are still dependent on the diffusion constant of the particular doping agent. Improvement is particularly desired in the production of compound semiconductor devices having regions which are uniformly doped, or heavily doped, or both.

An object of this invention is to provide improved semiconductor devices utilizing binary compound semiconductors.

Still another object of this invention is to provide an improved method of forming regions of given conductivity type in a binary compound semiconductor.

But another object is to provide an improved method of making rectifying barriers in binary compound semiconductor wafers.

These and other objects are accomplished by heating a semiconductive wafer composed essentially of a compound of a more volatile element with a less volatile element to a temperature below the melting point of said compound but above the temperature at which the compound appreciably decomposes. The more volatile element is thereby evaporated from the wafer surface, leaving a layer of the less volatile element over the surface of the wafer. The first heating step may be performed in an inert atmosphere, but is advantageously performed in a vacuum. The wafer is then reheated in an ambient atmosphere consisting of the vapors of the more volatile element and the vapors of a doping agent, or substance which is capable of inducing given conductivity type in the wafer. The time and temperature of the second heating step are sufficient substantially to reconvert the surface layer of the less volatile element to the original binary compound. The reconverted or reconstituted layer thus formed contains a sufficient amount of type-determining substance to be of given conductivity type. High concentration of the type-determining substance is readily attained in the reconstituted layer, and the concentration of the doping agent is uniform throughout the layer, instead of falling off with increasing depth as in diffused regions.

Figure 2:
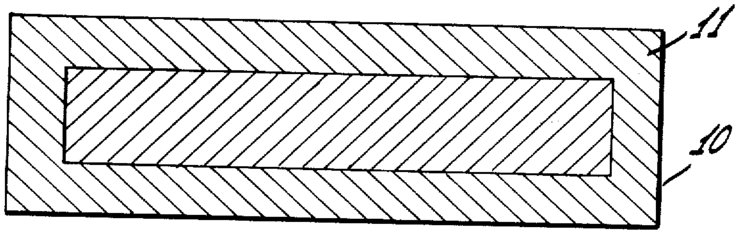
Figure 3:
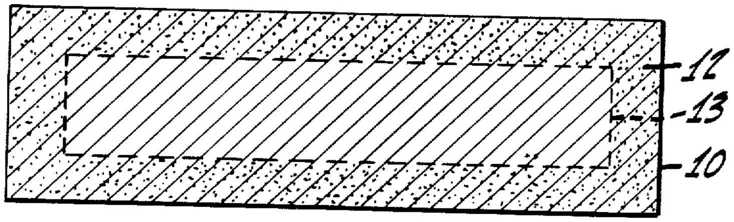
Figure 4:
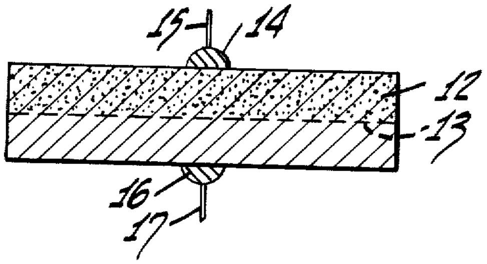

The invention and its features are described in greater detail in connection with the accompanying drawing, in which:

FIGURES 1–3 are cross-sectional elevational views of the method of forming a given conductivity type region in a binary compound semiconductive wafer in accordance with one embodiment of the invention; and, FIGURE 4 is a cross-sectional elevational view of a semiconductor device in accordance with the invention.

Similar reference numerals are applied to similar elements throughout the drawing.

Two preferred examples illustrate the formation of a reconstituted given conductivity type region in a binary compound wafer so as to introduce a rectifying PN junction into the wafer. However, it is to be understood that other types of barriers such as P–P+, N–N+, I–N, and P+–N+ may also be introduced into a binary compound wafer in accordance with the invention, and that any of the other binary compound semiconductors may be utilized together with the appropriate doping agents.

*Example I*

A semiconductive wafer 10 composed essentially of a binary compound of a more volatile element and a less volatile element is prepared in a convenient size and shape as shown in FIGURE 1. The wafer 10 may be of either conductivity type, or may be intrinsic. In this example, the wafer 10 consists of P-conductivity type gallium arsenide.

The wafer 10 is first heated to a temperature below the melting point of gallium arsenide (1240° C.) but above the temperature at which the compound begins to decompose by evaporation of the more volatile constituent element, which, in gallium arsenide, is arsenic. In this example, the wafer 10 is heated in a vacuum furnace for 5 minutes at about 800° C. The pressure in the furnace is maintained at about $1\times10^{-5}$ mm. Hg. During this step, arsenic evaporates from the wafer surface, leaving wafer 10 covered with a gallium surface layer 11, as shown in FIGURE 2. For greater clarity, the drawing is not to scale. The gallium surface layer 11 is actually thinner than illustrated.

The wafer 10 is now placed in a quartz ampule. About .05 g. arsenic and .002 g. sulfur are added to the ampule, which is then exhausted and sealed. The ampule is heated in a two-zone furnace for one hour, with that end of the ampule containing the gallium arsenide wafer maintained at 850° C., and the other end of the ampule maintained at 600° C. During this second heating step, the gallium surface layer 11 combines with the arsenic vapors in the ampule to form a reconverted or reconstituted gallium arsenide layer 12 over the surface of wafer 10, as shown in FIGURE 3. Since the gallium arsenide layer 12 has been reconstituted in an atmosphere including sulfur vapors, the reconstituted layer 12 contains sufficient sulfur donor atoms to induce N-conductivity type throughout the layer. A high concentration of sulfur donor atoms, greater than $10^{18}$ sulfur atoms per $cm.^3$, is thus readily attained. Furthermore, the distribution of sulfur atoms in this reconstituted layer is uniform, and the donor concentration does not decrease with increasing depth into the wafer, as does the concentration of the impurity material in diffused regions. A rectifying barrier 13 is formed at the interface or junction between the P-type bulk of the wafer and the sulfur-containing N-type reconstituted layer 12.

After the rectifying barrier 13 has been formed in wafer 10, the wafer may be utilized in the fabrication of various types of semiconductor devices by methods known to the art. By ways of illustration only and not as a limitation, the ends and lower half of the wafer 10 may now be removed by etching or grinding, leaving the wafer as shown in FIGURE 4 with a reconstituted sulfur-containing N-type region 12 adjacent one major face. The region adjacent the opposite major face is still the same P-conductivity type as the original wafer. An ohmic contact is made to the reconstituted N-type region 12 by alloying a tin electrode 14 to the major wafer face immediately adjacent region 12. A similar ohmic contact is made to the P-type region by coaxially alloying an indium electrode 16 to the opposite major face. To complete the device, lead wires 15 and 17 are attached to electrodes 14 and 16 respectively. The resulting diode unit may be encapsulated by methods known to the art. If the acceptor concentration in the original P-type wafer was high, such as about $10^{19}$ acceptor atoms per $cm.^3$, and the sulfur donor atom concentration in the reconstituted N-type region 12 is also about $10^{19}$ per $cm.^3$, then the resulting device is of the type known as a tunnel diode.

While the above example described the formation of an N-conductivity type region in a binary compound wafer, the method of the invention is equally applicable to the formation of P-conductivity type regions in binary compound wafers, as shown in the following example.

*Example II*

In this example, the semiconductor wafer consists of N-conductivity type gallium arsenide. The wafer is first heated as before in a vacuum to a temperature of about 800° C. for about 5 minutes. A surface layer of gallium is thereby formed over the wafer, due to the evaporation of arsenic from the wafer surface.

The wafer is now placed in a quartz ampule together with about .05 g. arsenic and .05 g. zinc. The ampule is exhausted, sealed, and heated in a two-zone furnace for 60 minutes. The end of the ampule containing the gallium arsenide wafer is maintained at 800° C., while the other end of the ampule is maintained at 600° C. Some of the arsenic vapors deposit in the cool end of the ampule, so that excess pressures are prevented. During this second heating step the gallium surface layer combines with the arsenic vapors in the ampule to form a reconverted or reconstituted gallium arsenide layer over the surface of the wafer. The reconstituted gallium arsenide layer contains sufficient zinc acceptor atoms to induce P-conductivity type throughout the layer. The zinc acceptor atoms are uniformly distributed through the reconstituted layer. A rectifying barrier is formed at the interface or junction between the N-conductivity type bulk of the wafer and the zinc-containing P-conductivity type reconstituted surface layer of gallium arsenide.

One advantage of the invention is that the devices produced thereby include zones in which the conductivity type-determining substance is uniformly distributed. Another advantage is the ease of fabrication, since it is not necessary to avoid establishment of an equilibrium when heat treating a semiconductive compound according to the invention.

It will be understood that in the practice of the invention any of the other III—V compounds may be utilized instead of gallium arsenide, and other appropriate donors such as selenium and tellurium may be utilized instead of sulfur while other appropriate acceptors such as cadmium and mercury may be utilized instead of zinc. Binary II—VI compounds may be similarly treated, utilizing the alkali metals of group I as the acceptor and the halogens of group VII as the donor.

Other modifications may be made without departing from the spirit and scope of the invention. It has been found that when a mask is placed on a compound semiconductive wafer and the mating surfaces of the mask and the wafer are both planar or are otherwise matching so that the mating surfaces are in close contact, then on heating the masked wafer the more volatile element of the compound evaporates from the exposed portion of the wafer surface, but does not evaporate from the masked portion thereof. Suitable masks for this purpose consist of inert refractory materials such as graphite and quartz. In one embodiment, a given conductivity type wafer consisting of a binary compound of a more volatile element and a less volatile element is masked so as to expose only a predetermined portion of one wafer surface. The masked wafer is heated in a vacuum to a temperature below the melting point of the compound but above the dissociation compound so as to drive off the more volatile element from the exposed portion of the wafer surface and leave a layer of the less volatile element thereon. The wafer is then reheated in an atmosphere consisting of the vapors of the more volatile element and a substance which induces opposite conductivity type in the wafer. As in the previous examples, the time and temperature of this reheating step is sufficient to reconvert the surface layer of the less volatile element to the original compound. The reconverted layer contains a sufficient amount of the conductivity type-determining substance to be of opposite conductivity type, so that on cooling the wafer a PN junction is formed between the reconstituted layer and the bulk of the wafer.

The embodiment described in Example I may be modified by masking all but one of the faces of a P-type gallium arsenide wafer. The masked wafer is then heated in a vacuum as in the example. Arsenic is volatilized from the exposed wafer face, leaving a layer of gallium on the exposed face only. The wafer is then reheated as in the example in an atmosphere consisting of the vapors of arsenic and sulfur, so as to reconvert the gallium surface layer to gallium arsenide. The converted layer contains sufficient sulfur to be of N-conductivity type, so that on cooling the wafer a PN junction is formed between the N-type layer and the P-type bulk of the wafer.

What is claimed is:

1. The method of forming a given conductivity type region in a compound semiconductive wafer, one of the elements of said compound being more volatile than another, comprising the steps of heating said wafer to a temperature at which said compound appreciably decomposes so as to volatilize said one element from the wafer surface and leave a layer of said another element on said surface, then reheating said wafer in an ambient consisting of the vapor of said one element and a substance which is capable of inducing said given conductivity type in said compound, the time and temperature of said reheating being sufficient to reconvert said surface layer of said another element to said compound, said reconverted layer containing a sufficient amount of said substance to be of given conductivity type.

2. The method of forming a given conductivity type region in a semiconductive wafer composed essentially of a binary compound of a more volatile element with a less volatile element, comprising the steps of heating said wafer to a temperature below the melting point of said compound but above the temperature at which said compound appreciably decomposes so as to evaporate said more volatile element from the wafer surface and leave a layer of said less volatile element on said surface, then reheating said wafer in an ambient consisting of the vapors of said more volatile element and a substance which is capable of inducing said given conductivity in said wafer, the time and temperature of said reheating being sufficient to reconvert said surface layer of said less volatile element to said compound, said reconverted layer containing a sufficient amount of said substance to be of given conductivity type.

3. The method of forming a given conductivity type region in a semiconductive wafer composed essentially of a compound of a more volatile element with a less volatile element, comprising the steps of heating said wafer in a vacuum to a temperature below the melting point of said compound but above the temperature at which said compound appreciably decomposes so as to evaporate said more volatile element from the wafer surface and leave a layer of said less volatile element on said surface, then reheating said wafer in an ambient consisting of the vapors of said more volatile element and a substance which is capable of inducing said given conductivity type in said wafer, the time and temperature of said reheating being sufficient to reconvert said surface layer of said less volatile element to said compound, said reconverted layer containing a sufficient amount of said substance to be of given conductivity type, said substance being incorporated in said surface layer during said reconversion and uniformly distributed within said reconverted layer.

4. The method of forming a given conductivity type region in a semiconductive wafer, said wafer consisting essentially of a binary compound of a more volatile element with a less volatile element, said compound being selected from the group consisting of the phosphides, arsenides, and antimonides of aluminum, gallium, and indium, and the sulfides and selenides of zinc and cadmium, comprising the steps of heating said wafer in a vacuum to a temperature below the melting point of said compound but above the temperature at which said compound appreciably decomposes so as to evaporate said more volatile element from the wafer surface and leave a layer of said less volatile element on said surface, then reheating said wafer in an ambient consisting of the vapors of said more volatile element and a substance which is capable of inducing said given conductivity type in said wafer, the time and temperature of said reheating being sufficient to reconvert said surface layer of said less volatile element to said compound, said reconverted layer containing a sufficient amount of said substance to be of given conductivity type, said substance being incorporated in said surface layer during said reconversion and uniformly distributed within said reconverted layer.

5. The method of forming an N-conductivity type region in a wafer of a semiconductive compound of a more volatile element with a less volatile element, comprising heating said wafer in a vacuum to a temperature below the melting point of said compound but above the temperature at which said compound appreciably decomposes so as to evaporate said more volatile element from the wafer surface and leave a layer of said less volatile element on said surface, then reheating said wafer in an atmosphere consisting of said more volatile element and a substance which is a donor in said semiconductive compound, the time and temperature of said reheating being sufficient to reconvert said surface layer of said less volatile element to said compound, said reconverted layer containing a sufficient amount of said donor substance to be of N-conductivity type, said substance being incorporated in said surface layer during said reconversion and uniformly distributed within said reconverted layer.

6. The method as in claim 5, in which said compound is selected from the group consisting of the phosphides, arsenides, and antimonides of aluminum, gallium, and indium, and said donor is selected from the group consisting of sulfur, selenium, and tellurium.

7. The method of forming a P-conductivity type region in a wafer of a binary semiconductive compound of a more volatile element with a less volatile element, comprising heating said wafer in a vacuum to a temperature below the melting point of said compound but above the temperature at which said compound appreciably decomposes so as to evaporate said more volatile element from the wafer surface and leave a layer of said less volatile element on said surface, then reheating said wafer in an atmosphere consisting of said more volatile element and a substance which is an acceptor in said semiconductor compound, the time and temperature of said reheating being sufficient to reconvert said surface layer of said less volatile element to said compound, said reconverted layer containing a sufficient amount of said acceptor substance to be of P-conductivity type, said substance being incorporated in said surface layer during said reconversion and uniformly distributed within said reconverted layer.

8. The method as in claim 7, in which said compound is selected from the group consisting of the phosphides, arsenides, and antimonides of aluminum, gallium, and indium, and said acceptor is selected from the group consisting of zinc and cadmium.

9. The method of forming a rectifying barrier in a given conductivity type wafer of a semiconductive compound consisting essentially of a more volatile element combined with a less volatile element, comprising the steps of heating said wafer in a vacuum to a temperature below the melting point of said compound but above the temperature at which said compound appreciably decomposes so as to evaporate said more volatile element from the wafer surface and leave a layer of said less volatile element on said surface, reheating said wafer in an atmosphere consisting essentially of the vapors of said more volatile element and a substance which induces opposite conductivity type in said semiconductive compound, the time and temperature of said heating being sufficient to reconvert said surface layer of said more volatile element to said compound, said reconverted layer containing a sufficient amount of said substance to be of opposite conductivity type, said substance being incorporated in said surface layer during said reconversion and uniformly distributed within said reconverted layer, and cooling said wafer so that a rectifying barrier forms between said reconverted layer and the remainder of said wafer.

10. The method of introducing a PN junction in a semiconductive wafer of given conductivity type, said wafer consisting essentially of a binary compound of a more volatile element and a less volatile element, said compound being selected from the group consisting of the phosphides, arsenides, and antimonides of aluminum, gallium, and indium, and the sulfides and selenides of zinc and cadmium, comprising the steps of masking said wafer so as to expose only a predetermined portion of one wafer surface, heating said masked wafer in a vacuum to a temperature below the melting point of said compound but above the dissociation temperature of said compound so as to drive off said more volatile element from the exposed wafer surface and leave a layer of said less volatile element on said exposed surface, then reheating said wafer in an atmosphere consisting of the vapors of said more volatile element and a substance which induces opposite conductivity type in said wafer, the time and temperature of said reheating being sufficient to reconvert said surface layer of said less volatile element to said compound, said reconverted layer containing a sufficient amount of said substance to be of opposite conductivity type, said substance being incorporated in said surface layer during said reconversion and uniformly distributed within said reconverted layer, and cooling said wafer so that a PN junction forms between said reconverted surface layer and the bulk of said wafer.

11. The method of forming a rectifying barrier in a P-conductivity type wafer of semiconductive gallium arsenide, comprising masking all but one of the faces of said wafer, heating said masked wafer in a vacuum to a temperature below the melting point of said wafer but above the temperature at which said wafer appreciably decomposes so as to volatilize arsenic from the exposed wafer face and leave a layer of gallium on said exposed face, then reheating said wafer in an atmosphere consisting of the vapors of arsenic and sulfur, said reheating being performed for a period of time and at a temperature sufficient to reconvert said surface layer of gallium to gallium arsenide, said reconverted layer containing a sufficient amount of sulfur to be of N-conductivity type, said substance being incorporated in said surface layer during said reconversion and uniformly distributed within said reconverted layer, and cooling said wafer so that a PN junction forms between said N-type surface layer and the P-type bulk of said wafer.

12. The method of forming a rectifying barrier in a P-conductivity type wafer of semiconductive gallium arsenide, comprising masking all but one of the faces of said wafer, heating said masked wafer in a vacuum to a temperature below the melting point of said wafer but above the temperature at which said wafer appreciably decomposes so as to volatilize arsenic from the exposed wafer face and leave a layer of gallium on said exposed face, then reheating said wafer in an atmosphere consisting of the vapors of arsenic and sulfur, said reheating being performed for a period of time and at a temperature sufficient to reconvert said surface layer of gallium to gallium arsenide, said reconverted layer containing about $10^{18}$ atoms of sulfur per $cm.^3$ uniformly distributed therein, and cooling said wafer so that a PN junction forms between said reconverted layer and the P-type bulk of said wafer.

References Cited in the file of this patent

UNITED STATES PATENTS

| | | |
|---|---|---|
| 2,692,839 | Christensen et al. | Oct. 26, 1954 |
| 2,846,340 | Jenny | Aug. 5, 1958 |
| 2,900,286 | Goldstein | Aug. 18, 1959 |
| 2,928,761 | Gremmelmaier et al. | Mar. 15, 1960 |
| 2,929,859 | Loferski | Mar. 22, 1960 |
| 2,950,220 | Genser et al. | Aug. 23, 1960 |
| 2,979,428 | Jenny et al. | Apr. 11, 1961 |

FOREIGN PATENTS

| | | |
|---|---|---|
| 1,193,194 | France | Apr. 27, 1959 |

UNITED STATES PATENT OFFICE
CERTIFICATE OF CORRECTION

Patent No. 3,096,219 July 2, 1963

Herbert Nelson

It is hereby certified that error appears in the above numbered patent requiring correction and that the said Letters Patent should read as corrected below.

Column 5, line 17, before "at" insert -- below the melting point of said compound but above the temperature --; line 39, after "conductivity" insert -- type --.

Signed and sealed this 11th day of February 1964.

(SEAL)
Attest:
ERNEST W. SWIDER

Attesting Officer

EDWIN L. REYNOLDS

Acting Commissioner of Patents